United States Patent [19]

Denk et al.

[11] 4,443,787

[45] Apr. 17, 1984

[54] APPARATUS FOR MEASURING THE ANGULAR POSITION OF A SHAFT

[75] Inventors: Heimo Denk, Feldbach; Peter Mantsch, Graz, both of Austria

[73] Assignee: Hans List, Graz, Austria

[21] Appl. No.: 356,478

[22] Filed: Mar. 9, 1982

Related U.S. Application Data

[63] Continuation of Ser. No. 117,002, Jan. 30, 1980, abandoned.

[51] Int. Cl.$^3$ ..................... H03K 13/02; H03K 13/20
[52] U.S. Cl. .................... 340/347 P; 250/231 SE; 340/347 M; 307/356; 307/360; 377/17
[58] Field of Search ....................... 340/347 M, 347 P; 250/231 SE; 307/358, 360, 356; 324/178; 364/558, 559; 377/17

[56] References Cited

U.S. PATENT DOCUMENTS

| | | | |
|---|---|---|---|
| 2,929,927 | 3/1960 | Beloungie | 328/135 X |
| 3,513,400 | 5/1970 | Russell | 328/135 X |
| 3,519,849 | 7/1970 | Tyler | 328/135 X |
| 3,745,544 | 7/1973 | Ono | 340/870.22 |
| 3,804,979 | 4/1974 | Knowles | 307/358 X |
| 3,955,070 | 5/1976 | Suzuki et al. | 364/558 X |
| 4,007,357 | 2/1977 | Yanagishima | 377/45 |
| 4,169,232 | 9/1979 | Henrich | 307/358 X |
| 4,171,522 | 10/1979 | Powell | 340/347 P X |
| 4,201,911 | 5/1980 | Dering | 340/347 P X |
| 4,240,069 | 12/1980 | Hullein et al. | 340/347 P |

FOREIGN PATENT DOCUMENTS 2347800  4/1975  Fed. Rep. of Germany .

*Primary Examiner*—T. J. Sloyan
*Attorney, Agent, or Firm*—Watson, Cole, Grindle & Watson

[57] ABSTRACT

An apparatus is disclosed, for measuring the angular position of a shaft of a machine at the occurrence of an event originating from the operation of the machine, relative to a reference position of the shaft. The apparatus comprises a first sensor responsive to the reference position of the shaft (signal II) and a second sensor which, on the occurrence of the event, produces an output pulse and which produces a number of interference pulses in the periods between production of the output pulses (signal I). A comparator (4) having a threshold value which is capable of being exceeded both by the required pulses and the interference pulses, and a recognition circuit (3,6) which is adapted to recognize output pulses produced on the occurrence of the event, are arranged to control an evaluation circuit such as a counter (10). The evaluation circuit ascertains, e.g. by counting angular increment marker pulses (signal III), the angle through which the shaft rotates between the time when the threshold of the comparator (4) was last exceeded prior to triggering of the recognition circuit by the required event, and the time when the shaft reaches the reference position.

13 Claims, 3 Drawing Figures

APPARATUS FOR MEASURING THE ANGULAR POSITION OF A SHAFT

This is a Continuation of appliction Ser. No. 117,002 filed Jan. 30, 1980, abandoned.

BACKGROUND OF THE INVENTION

This invention relates to an apparatus for measuring the angular position of a shaft of a machine at the occurrence of an event originating from the operation of the machine, relative to a reference position of the shaft.

DESCRIPTION OF THE PRIOR ART

A problem in such apparatus lies in deriving a trigger signal from the event originating from the operation of the machine, for example a rise in pressure in a fuel injection line to an engine, which, together with a second trigger signal corresponding to a definite angular position of the crankshaft, is used to evaluate the angle through which the shaft has rotated between the occurrence of the event and the reference position. The trigger signal obtained from the pressure curve should in the ideal case be produced at the very beginning of the characteristic pressure rise that occurs in the injection line on each working cycle of the engine. It is, however, necessary to produce the trigger pulse only when a predetermined threshold pressure is exceeded so as to prevent spurious triggering which, for example, can be set off by the ever-present interference or noise signals which occur before the actual pressure rise. Previous solutions to this problem make use of a voltage comparator controlled by the actual injection line pressure signal, the threshold response level of the comparator being set above the level of the interference signals occurring before the pressure rise. However, where the interference signals occurring before the required pressure rise are large, the response level of the comparator must be made high, thus moving very far away from the ideal requirement of producing a trigger signal when the pressure rise first begins.

It has also been proposed, in West German OLS No. 2 347 800, to feed the signal produced by a suitable sensor to an integrator and to connect the integrator to a threshold value switch. By this means interfering pulses having voltage-time areas which are less than a predetermined value set by the response threshold of the threshold value switch, are suppressed. In practice this arrangement is only suitable for cases in which only very short duration interference pulses of high voltage level arise, for example noise spikes induced in long conductors. Another drawback of such a circuit arrangement lies in the fact that the evaluation of the angle through which the shaft rotates, begins after a delay which depends on the response threshold of the switch. This delay is not taken into account in the evaluation, and the length of the delay depends on the shape of the interfering pulses, making the evaluation inaccurate.

SUMMARY OF THE INVENTION

It is an aim of the invention to provide an apparatus which is capable of reliably producing a trigger signal, even in the presence of large interference pulses which arrive before the actual signal indicating the occurrence of the event originating from the operation of the machine, and coming as near as possible to the ideal requirements.

According to the invention, an apparatus for measuring the angular position of a shaft of a machine at the occurrence of an event originating from the operation of the machine, relative to a reference position of the shaft, comprises a first sensor responsive to the reference position of the shaft, a second sensor which, on the occurrence of the event, produces an output pulse and which produces a number of interference pulses in the periods between the production of the output pulses an evaluation circuit which is adapted to derive a signal which is proportional to the angle through which the shaft rotates between the occurrence of the event and the reference position, a threshold value switch arranged to receive the signals from the second sensor and having a threshold value which is capable of being exceeded both by the output pulses and the interference pulses, and a recognition circuit which is adapted to recognize the output pulses producted on the occurrence of the event, the threshold value switch and the recognition circuit being arranged to operate the evaluation circuit from the time when the threshold value of the switch was last exceeded before the recognition circuit recognizes that an event has occurred, to the time when the first sensor indicates that the shaft has reached the reference position, so as to ascertain the angle through which the shaft rotates during this period.

The first sensor may comprise a stroboscope and the threshold value switch may be a comparator.

Whenever an interference pulse exceeds the threshold value of the switch, the output level of the threshold value switch changes, for example from "low" to "high" and, on falling below the threshold level, the output changes from "high" to "low". It is therefore possible, on each such transition of the switch from "low" to "high" to commence the evaluation process, and on every transition of the switch from "high" to "low" to stop and reset the evaluation circuit. This process can be repeated until the transition of the switch output from "low" to "high" is no longer caused by interference pulses but by an actual signal which corresponds to the occurrence of the event, whereupon the evaluation process is continued until the reference position of the shaft is reached.

Also it is possible to keep the threshold value of the switch low, so that the evaluation process can start immediately on the occurrence of the event. Furthermore, it is possible to ascertain by means of the recognition circuit, whether the pulse provided by the second sensor is an interference pulse or not. If the pulse is merely an unwanted noise pulse, the evaluation process is either reset to zero or is not even started in the first place. Alternatively, it is possible to delay the evaluation of an incoming pulse by a predetermined time delay, during which it is possible to ascertain whether the pulse is the required one or not, and to delay the reference angle signal by the same period of time. In this way it is ensured that in the evaluation, account is taken of the time interval between the start of the required pulse corresponding to the event, and the recognition of the pulse.

Particular advantages are obtained if the evaluation circuit comprises a counter having a counter input which receives signals associated with angular increments of the shaft, which is triggered when the signal from the second sensor exceeds the threshold of the threshold value switch, and which is re-set by signals which are derived when the signal from the second sensor falls below the threshold of the threshold value switch. In this case the evaluation circuit is particularly simple and reliable in operation.

It is furthermore also possible for the evaluation circuit to comprise a computer or microprocessor, and in this case advantages are obtained with regard to the further processing of the angular value obtained.

According to one preferred embodiment of the invention, the threshold of the threshold value switch corresponds to a predetermined constant proportion of the peak value of the signal from the second sensor. In another preferred embodiment, the threshold of the threshold value switch corresponds to a predetermined fixed value.

In a particularly advantageous embodiment of the invention the recognition circuit comprises a second threshold value switch which receives signals from the second sensor, the threshold value of this switch being higher than that of the first switch, and a timing circuit, such as a monostable flip-flop, responsive to the output of the second threshold value switch. In this way it is possible in a very simple manner to recognize the required pulse. The response threshold of the second switch can be made relatively high so that the interference pulses which occur before the required pulse do not trigger the recognition circuit. The timing circuit ensures furthermore that on each rotation of the shaft, only one recognition signal is produced, and no interference signals such as those arising from reflections following the required event, which can reach high levels, influence the evaluation circuit.

However, the recognition circuit may take other forms. The recognition circuit can, if desired, comprise a differentiator which produces a signal dependent on the rate of change of the signal from the second sensor, which can be tested for level or for a predetermined minimum duration, so that it is possible to recognize the required pulse and thereupon produce a recognition signal. Moreover it is also possible in many cases to recognize interference pulses by the fact that they last for less than a predeterminded minimum time.

In another much preferred embodiment, the recognition circuit comprises a second threshold value switch which receives signals from the second sensor, the threshold value of this switch being higher than that of the first switch, and a switch of a constant-voltage integrator connected to the output of the second threshold value switch, the switch of the constant-voltage integrator being arranged to re-set and stop or set running the constant-voltage integrator according to the switching state of the second threshold value switch, and the output of the integrator being connected to a first input of a third threshold value switch and to a peak value store following which there is connected a potential divider having an intermediate terminal connected to the threshold value input of the third threshold value switch.

In yet another preferred embodiment, the recognition circuit comprises a second threshold value switch which receives the signals from the second sensor, the threshold of this switch being higher than that of the first switch, the output of the first threshold value switch being connected to a timer, preferably a retriggerable monostable flip-flop, and the output of the timer and of the second threshold value switch being combined by an AND gate which acts to trigger the evaluation circuit, and a correction circuit being arranged to compensate for the delayed starting of the evaluation circuit caused by the presence of the timer.

The correction circuit preferably comprises a monostable flip-flop connected between the first sensor and the evaluation circuit.

Preferably, the counter input of a counter forming the evaluation circuit is connected to a sensor which responds to angular increment marks applied to the shaft of the machine or to a disc or the like rotating in a constant angular speed relationship to the shaft.

Preferably, the counter input of a counter forming the evaluation circuit is connected to a frequency multiplying circuit which multiplies by a factor $\alpha k$ a signal derived from a pair of reference marks, k signifying the angular resolution and $\alpha$ signifying the angle between the two reference marks.

Where a particularly high degree of measuring accuracy is required, this may be achieved if the counter input of a counter forming the evaluation circuit is supplied with a constant frequency signal and the output of this counter is connected to a computer which also receives information on the angular speed of the shaft. The computer preferably determines the angular speed of the shaft by counting pulses of constant frequency that occur in the time interval between two reference angle signals.

In order to expedite further processing of the result obtained by the evaluation circuit, which is proportional to the angle through which the shaft rotates between the occurrence of the event and the reference position, the output of the counter is preferably connected to a store, information from the counter being entered into the store in response to the output of the first sensor or a signal derived from that output.

DESCRIPTION OF THE DRAWINGS

The invention is described below, by way of example only, with reference to the drawings, in which.

DESCRIPTION OF THE PREFERRED EMBODIMENT

The circuit to be described may be used, for example, to measure the angular position of a crankshaft of an engine, and operation of the circuit will be described with this application in mind, although it will be appreciated that the circuit has many other uses.

Figure 2:
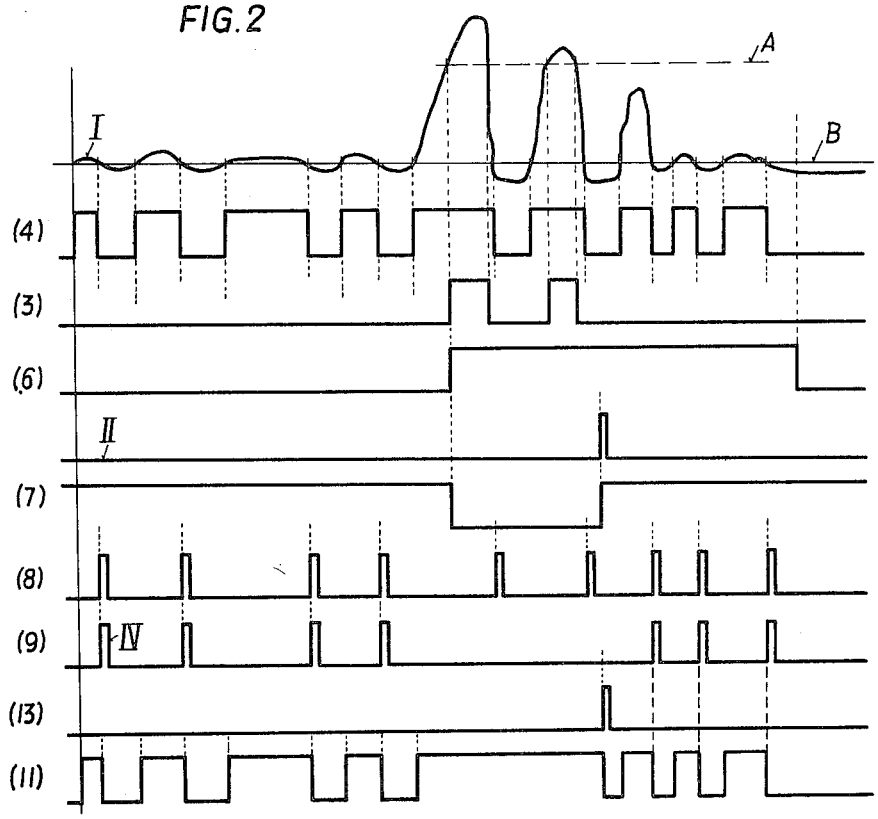
FIG. 2 shows voltage waveforms at various points in the circuit.

A signal I is produced by a sensor (not shown) for sensing the occurrence of an event which is related to the position of the crankshaft, the event in this case being a rise in pressure in the fuel injection line to the engine. This signal is fed through a capacitive coupling 1 to a peak value store 2 and to two comparators 3 and 4. As shown in FIG. 2, signal I contains a number of noise pulses in addition to the required pulse, some of which are caused by reflections of the required pulse. The output of the peak value store 2 which corresponds to the peak value of signal I, is fed to a potential divider 5 which derives two reference voltages A, B, which are fed to the reference (threshold value) inputs of the comparator 3, 4 respectively. The comparator 3 receives a reference voltage A which is for example 65% of the peak value of the pressure signal I, and the comparator 4 receives a reference voltage B which is for example 17% of the peak value of the pressure signal and which is exceeded by noise pulses as well as by the required pulses. When the input signal to each comparator exceeds the applied reference voltage, the comparator produces a high level output signal, as shown in FIG. 2.

The output of comparator 3 is fed to a monostable flip-flop 6 having a time constant which is less than the duration of one working cycle of the engine, but which is long enough to ensure that only one pulse is generated during a working cycle, as illustrated in FIG. 2. Comparator 3 and monostable flip-flop 6 together form a recognition circuit for recognizing the required pulses.

A bistable flip-flop 7 is controlled by the rising edges of output pulses from the monostable flip-flop 6 and of the pulses of a reference signal II which is produced by a second sensor (not shown) which is adapted to generate a pulse whenever the crankshaft reaches a predetermined reference position, for example when a piston of the engine reaches the upper limit of its travel. The waveforms of signal II and of the signal produced by the bistable flip-flop 7, are shown in FIG. 2.

The output of the comparator 4 is fed to a monostable flip-flop 8. This flip-flop 8 produces a pulse of relatively short duration, as shown in FIG. 2, at the falling edge of each pulse from the comparator 4. The output signals of both flip-flops 7 and 8, are combined in an AND gate 9. The output signal IV, shown in FIG. 2, of this AND gate is used to re-set a counter 10, as will be described below.

The output signal of flip-flop 7 is fed to the inverted input 14 of an OR gate 11, and the output signal of comparator 4 is fed to the other input of this OR gate. The resulting output signal V, shown in FIG. 2, of OR gate 11 is fed to an input of the counter 10 to control the counter. A signal III comprises a series of angle marker pulses produced by a sensor responsive to angle marks, for example at angular increments of 0.1° of rotation of the crankshaft, the marks being applied to the shaft or to a disc or the like rotating in a constant angular speed relationship to the shaft, and these pulses are fed to the counter input of the counter 10. This counter 10, which constitutes an evaluation circuit, is arranged to count the number of angle marker pulses of signal III which occur during each pulse of the signal V. The counter is re-set following each pulse of signal V, by the re-set pulses of signal IV. It will be appreciated that the counter operates during the pulses of signal V which are caused by unwanted noise pulses as well as during the required pulses, but only counts which take place during the required pulses of signal V are used, as will be explained below. It will be seen from FIG. 2 that the required pulses of signal V last from the instant the pressure signal I exceeds the reference value B until the arrival of a reference pulse of signal II. The number of angle marker pulses of signal III received by the counter during this period will therefore give an indication of the angle through which the shaft has moved between the start of the event and the reference position.

The binary output of signal V of the counter 10 is fed to a store 12 which, when the appropriate order is given, stores the number to which the counter has counted. This order is given to the store 12 by a monostable flip-flop 13 which receives the output signals from the flip-flop 7 and produces a short pulse on the leading edge of each pulse received from the flip-flop 7, as shown in FIG. 2. The information in store 12 is retained until required for further processing, and may for example be displayed as a numerical readout of the angle through which the shaft has moved between the occurrence of the event and the reference position.

The circuit described above may be modified by feeding the comparator 4 which a fixed reference value, for example corresponding to a pressure of 30 bar.

In a modification of the device described above, the counter 10 does not count angle marker pulses, but pulses of constant frequency f 1, and the binary output signal from the counter is fed to a computer 14. The computer also receives information to enable it to determine the angular speed of the shaft, which may be derived for example by counting pulses of constant frequency received in the time which the shaft takes to rotate between two predetermined positions. The angle of rotation between the event and the reference position is obtained by dividing together these two items of information, and by multiplying the result by a predetermined figure which depends upon the angular resolution k and the angle $\alpha$ between the two predetermined positions of the shaft in frequency multiplier circuit 14a.

Figure 1:
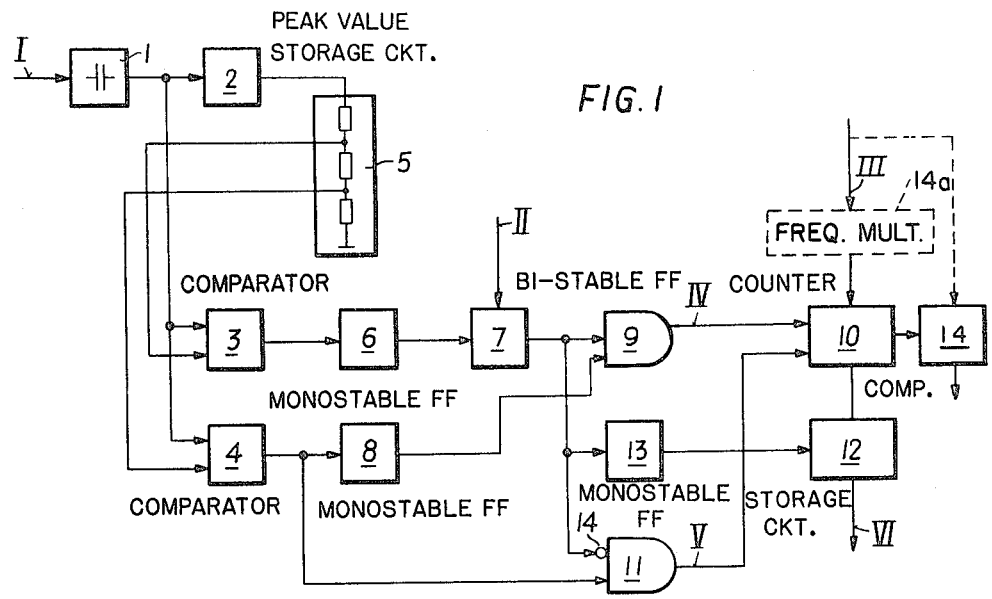
FIG. 1 is a block circuit diagram of a preferred embodiment.
Figure 3:
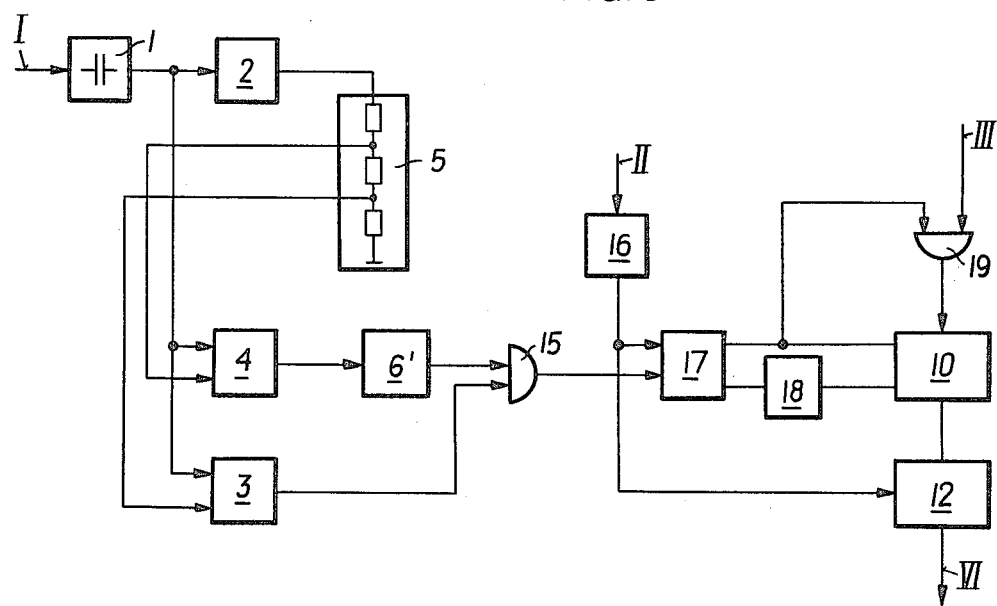
FIG. 3 is a block circuit diagram of another preferred embodiment.

In the embodiment shown in FIG. 3, the two comparators 3 and 4 are supplied with signal I through the capacitive coupling 1, the peak value store 2, and the potential divider 5, as in the embodiment of FIG. 1. The comparator 4 has the lower threshold value and is followed by a re-triggerable monostable flip-flop 6', the output of which is connected to and AND gate 15. The second input of this AND gate is connected to the output of the second comparator 3 having the higher threshold value.

This AND gate 15 is connected to one input of a bistable flip-flop 17, the second input of which is connected to a monostable flip-flop 16 controlled by the reference position pulse signal III. Flip-flop 16 has the same time constant as flip-flop 6', this time constant being less than the duration of the required pulses of signal I.

The output of flip-flop 17 controls the counter 10 which receives angle marker pulses III via an AND gate 19 which is also controlled by the output of flip-flop 17. The counter 10 is connected to a store 12 which, under the control of the rising edge of pulses supplied by the flip-flop 16, stores the number reached by the counter 10 The counter is re-set by signals from bistable flip-flop 17 which are fed to the counter via a delay circuit 18.

When the threshold value of the comparator 4 is exceeded, whether by a noise pulse or by a required event pulse, the flip-flop 6' is triggered and its output changes state to deliver a logic 0 at its output. Flip-flop 6' may be re-triggered whilst the output is at logic 0. If the threshold value of the comparator 3, which constitutes a recognition circuit, is exceeded whilst the flip-flop 6' is at logic 0, as soon as flip-flop 6' reverts to logic 1 the AND gate 15 produces a signal which switches bistable flip-flop 17, which in turn triggers the counter 10 and simultaneously allows marker pulses III to pass via AND gate 19 to the counter 10.

When a reference position pulse II arrives, the flip-flop 16 is triggered to produce a logic 0 pulse having the same duration as those of flip-flop 6'. On reversion of flip-flop 16 to logic 1, the bistable flip-flop 17 is switched state again, and the flow of marker pulses III to counter 10 is interrupted. The rising edge of the signal from flip-flop 16 causes the binary number counted by the counter 10 to be transferred to the store 12. After a delay caused by the delay circuit 18, the counter 10 is re-set to zero.

Therefore, in this embodiment, the start of the evaluation by counter 10 is delayed by a predetermined time corresponding to the time constant of flip-flop 6', but this delay is taken into account because the reference position pulses II are delayed by the same amount by the flip-flop 16.

The individual elements of the above circuits are readily available in the form of integrated circuits and so have not been described in detail.

We claim:

1. Apparatus for measuring the angular position of a rotating machine element relative to a reference position thereof, comprising:
   a recognition circuit responsive to an input signal containing a signal component responsive to an event originated by the operation of the machine and noise and providing first output signals upon the occurrence of said event;
   a first threshold sensing circuit responsive to said input signal and having a first threshold level less than the level of said given event and the level of said noise and providing second output signals with said input signal exceeding said threshold level; and
   an evaluation circuit for generating a signal representative of the angle of rotation of said rotating machine element between said reference position and the occurrence of said event in response to said first and second output signals, and including means for receiving counting signals representative of movement of said rotating machine element, and being triggered by said second signals, and said apparatus further comprising reset means providing a reset signal to said means for receiving counting signals with the level of said input signals less than said first threshold level, said evaluation circuit further including a bistable device set by said first signal to deliver a substantially continuous enabling signal to said counting means and being reset by a signal representative of said reference position, and storage means for storing the output of said means for receiving counting signals after said reference position is reached.

2. Apparatus as claimed in claim 1 in which said first threshold level corresponds to a predetermined constant proportion of the peak value of said input signal.

3. Apparatus as claimed in claim 1 in which said threshold value corresponds to a predetermined fixed value.

4. Apparatus as claimed in claim 1 in which said recognition circuit has a second threshold level higher than said first threshold level, and further including a switching circuit having a predetermined reset interval and being responsive to said first output signal and a signal indicating the reference position of said rotating machine element to produce a signal for resetting said evaluation circuit.

5. Apparatus as claimed in claim 1 in which said recognition circuit includes a second threshold sensing circuit with a second threshold level higher than said first threshold level and a constant-voltage integrator switch responsive to the output of said second threshold sensing circuit to be reset thereby, said means for receiving counting signals includes a counter having a counter input for receiving said counting signals representative of movement of said rotating machine element, and further comprising storage means for storing the contents of said counter and a storage switch means for initiating the storage of the contents of said counter into said storage means and responsive to the output of said constant-voltage integrator, a peak value storage circuit responsive to said input signal and a potential divider connected to said peak value storage circuit for providing said first and second threshold levels.

6. Apparatus as claimed in claim 1 in which said counter is triggered by said second signals, and said apparatus further comprising reset means providing a reset signal to said counter with the level of said input signals less than said first threshold level.

7. Apparatus as claimed in claim 1 in which said means for receiving counting signals includes a counter having a counter input for receiving signals representative of the angular incremental movement of the rotating machine element, and further comprising a frequency multiplying circuit for multiplying by a factor $\alpha K$ the signal derived from a pair of reference marks on said rotating machine element, where K is angular resolution and $\alpha$ represents the angle between said two reference marks.

8. Apparatus as claimed in claim 1 in which said means for receiving counting signals includes a counter having a counter input for receiving signals of a constant frequency, and further comprising computer means for receiving the contents of said counter and signals representative of the angular speed of rotation of said rotating machine element whereby the angular rotation of said rotating machine element is computed.

9. Apparatus as claimed in claim 8 in which said counter is adapted to count said pulses of constant frequency occurring in a time interval represented by two reference angle signals.

10. Apparatus as claimed in claim 1 wherein said means for receiving counting signals includes a counter and further comprising storage means for storing the contents of said counter in response to a signal representative of said reference position.

11. Apparatus for measuring the angular position of a rotating machine element relative to a reference position thereof, comprising:
   a recognition circuit responsive to an input signal containing a signal component responsive to an event originated by the operation of the machine and noise and providing first output signals upon the occurrence of said event;
   a first threshold sensing circuit responsive to said input signal and having a first threshold level less than the level of said given event and the level of said noise and providing second output signals with said input signal exceeding said threshold level;
   an evaluation circuit for generating a signal representative of the angle of rotation of said rotating machine element between said reference position and the occurrence of said event in response to said first and second output signals, and including means for receiving counting signals representative of movement of said rotating machine element, and being triggered by said second signals, and said apparatus further comprising reset means providing a reset signal to said means for receiving counting signals with the level of said input signals less than said first threshold level;
   said recognition circuit includes a second threshold sensing circuit responsive to said input signals and having a threshold level higher than said first threshold level; and a re-triggerable switching circuit having a specified time constant, and an AND gate having inputs connected to the output of said second threshold sensing circuit and the output of said re-triggerable switching circuit and providing an output for triggering said evaluation circuit, a second switching circuit having the same time constant as said specified time constant and being responsive to a signal representing a reference position of said rotating machine element for resetting said evaluation circuit.

12. Apparatus as claimed in claim 11 in which said re-triggerable switching circuit is a re-triggerable monostable flip-flop.

13. Apparatus as claimed in claim 12 in which said second switching circuit is a monostable flip-flop.

* * * * *